(12) United States Patent
Petz et al.

(10) Patent No.: US 6,388,605 B1
(45) Date of Patent: May 14, 2002

(54) CIRCUIT FOR GENERATING AND/OR DETECTING A RADAR SIGNAL

(75) Inventors: Anton Felix Petz, Xa Leiderdorp (NL); Narasimha Cheemalamarri Venkata, Ahmedabad (IN)

(73) Assignee: Agence Spatiale Europeenne, Paris (FR)

( * ) Notice: Subject to any disclaimer, the term of this patent is extended or adjusted under 35 U.S.C. 154(b) by 40 days.

(21) Appl. No.: 09/590,132

(22) Filed: Jun. 9, 2000

(30) Foreign Application Priority Data

Jun. 9, 1999 (FR) .............................. 99 07258

(51) Int. Cl.[7] .............................................. G01S 13/90
(52) U.S. Cl. ........................................................ 342/25
(58) Field of Search ................................... 342/25, 194

(56) References Cited

U.S. PATENT DOCUMENTS 4,881,079 A * 11/1989 Peregrim .................... 342/194
5,374,903 A    12/1994 Blanton ......................... 331/4
5,819,169 A    10/1998 Fudem ......................... 455/326
5,862,466 A     1/1999 Erickson ...................... 455/326
5,870,670 A     2/1999 Ripley et al. ................ 455/304

FOREIGN PATENT DOCUMENTS

GB          2299908           10/1996

\* cited by examiner

*Primary Examiner*—Daniel T. Pihulic
(74) *Attorney, Agent, or Firm*—Sughrue Mion PLLC

(57) ABSTRACT

The invention relates to a circuit for generating and/or detecting a radar signal for synthetic aperture radar in which the radar signal is subdivided into N sub-bands which are processed in parallel in N processing channels, each having a first mixer for processing in-phase signals, and a second mixer for processing quadrature signals. In the circuit the mixers of the N processing channels are in the form of identical mixer modules each comprising at least one mixer, and each module is associated with at least one external element for adjusting the mixer module in correspondence with the sub-band with which it is associated.

13 Claims, 4 Drawing Sheets

CIRCUIT FOR GENERATING AND/OR DETECTING A RADAR SIGNAL

The present invention relates to a circuit for generating and/or detecting a radar signal for synthetic aperture radar (SAR) in which the radar signal is subdivided into N sub-bands which are processed in parallel in N processing channels, each of which is provided with a mixer.

BACKGROUND OF THE INVENTION

In known techniques, each channel requires a specific mixer to be implemented. For example, the technique described in the work "Radar signals" by Charles E. Cook, pages 161–164 (published by Martin Bernfeld, 1967) implements local oscillators all having the same center frequency for each of the channels, associated with identical compression filters, however the mixers are different for the various channels.

U.S. Pat. No. 5,870,670 (Motorola) relates to an integrated mixer in an integrated circuit for forming an image-rejection mixer. The use of such a mixer implies making an integrated circuit that is specific for each frequency band to be processed.

In addition, U.S. Pat. No. 5,862,466 (Hewlett-Packard) proposes a radio frequency (RF) mixer which reduces peaks between signals at the local oscillator frequency and at the intermediate frequency, but which can operate only in systems presenting a single and determined intermediate frequency.

Finally, U.S. Pat. No. 5,819,169 discloses a balanced dual mixer implemented on a monolithic microwave integrated circuit (MMIC) including a diode bridge and two baluns. The mixer described in that document also requires a specific integrated circuit to be implemented for each frequency band (or sub-band), and it does not make it possible to eliminate the residual unbalance of the separators and the phase mixers, nor does it eliminate mismatches between mixers which give rise to leakage at the frequency of the local oscillator (LO).

OBJECTS AND SUMMARY OF THE INVENTION

An object of the present invention is to provide a circuit that makes it possible to avoid at least one of the above-specified drawbacks, at least to a large extent.

To this end, the invention provides a circuit for generating and/or detecting a radar signal for synthetic aperture radar in which the radar signal is subdivided into N sub-bands which are processed in parallel in N processing channels, each having a first mixer for processing in-phase signals, and a second mixer for processing quadrature signals, wherein the mixers of the N processing channels are in the form of identical mixer modules each comprising at least one mixer, and wherein each module is associated with at least one external element for adjusting the mixer module in correspondence with the sub-band with which it is associated.

The mixers are advantageously symmetrical dual-switched diode mixers. Each mixer may have a dual diode mixer coupled to inlet and outlet terminals via respective inlet and outlet baluns which form part of the mixer module and which may present an external control element for adjusting amplitude balance and/or an external control element for balancing phase, the phase balancing element serving in particular to compensate for any residual leakage at the frequency of a local oscillator (LO).

External compensation capacitors can make it possible to compensate leakage at local oscillator frequencies, at least in part. Said external element is advantageously a quarterwave delay line.

The dual mixers may have a DC external control element for adjusting their RF parameters.

The dual mixers can have external devices at their outlets for adjusting amplitude and phase so as to enable image frequency rejection to be adjusted.

The mixer module can have at least one differential amplifier presenting a main differential stage having two transistors and a circuit for adjusting amplitude and phase, comprising an auxiliary differential stage having two transistors connected in parallel with the main differential stage and connected so as to inject compensation current into the drain of one of the transistors of the main differential stage, with the compensation current being adjusted by calibrating the capacitance of an external compensation capacitor interconnecting the sources of the two transistors of the auxiliary differential stage.

The mixer may be placed in a monolithic microwave integrated circuit which can also have a temperature compensation circuit and/or a summing circuit.

BRIEF DESCRIPTION OF THE DRAWINGS

Other characteristics and advantages of the invention will appear more clearly on reading the following description given with reference to the accompanying drawings, in which.

MORE DETAILED DESCRIPTION

As a general rule, chirp radar signals are generated, and echo signals are detected, in coherent manner in baseband by using digital techniques. This requires pulse compression or expansion filters to have passbands that can be as broad as several hundreds of MHz.

One way of avoiding the need for high clock rates for the digital electronics, and of reducing the amount of signal processing that is required for such passbands, is to work in a frequency sub-band with limited bandwidth, using modular electronics. Thus, suggestions have been made to separate the total bandwidth of the signal into a number of sub-bands and to transpose each of the sub-bands into a single common baseband window, using different local oscillator frequencies, prior to digitizing. That requires processing which is performed in parallel in as many processing channels as there are sub-bands.

As mentioned above, the idea on which the invention is based is that the modules associated with each sub-band should be identical as far as possible, so that processing is made possible using a single hybrid circuit, that is common to all of the processing channels.

To this end, the hybrid circuit is made insensitive to frequency by external placement of those components (in particular 90° phase shifters) which have values that depend on the window associated with the sub-band in which the hybrid circuit is used. A 90° phase shift can be obtained in simple manner by using a link of length λ/4 which is easy to implement outside the hybrid circuit, e.g. on the mother card on which the hybrid circuits are located.

It is possible to associate each hybrid circuit with one or more external filters, e.g. located on the mother card in order to deal with image frequency rejection problems and with leakage at the frequency of the local oscillator of the mixer.

In order to avoid the need to associate external filters with the hybrid circuits, the mixer is preferably designed to present a signal suppression ratio at the local oscillator frequency and an image frequency rejection ratio that are both greater than 35 dB, and preferably greater than 40 dB.

As explained below, with reference to a preferred embodiment of the invention, the mixer of the invention can be adjusted by means of a DC adjustment voltage without any need for critical adjustment to be performed at radio frequencies (≈50 MHz) and with signal processing characteristics that make it possible to avoid the use of external filters.

Figure 1:
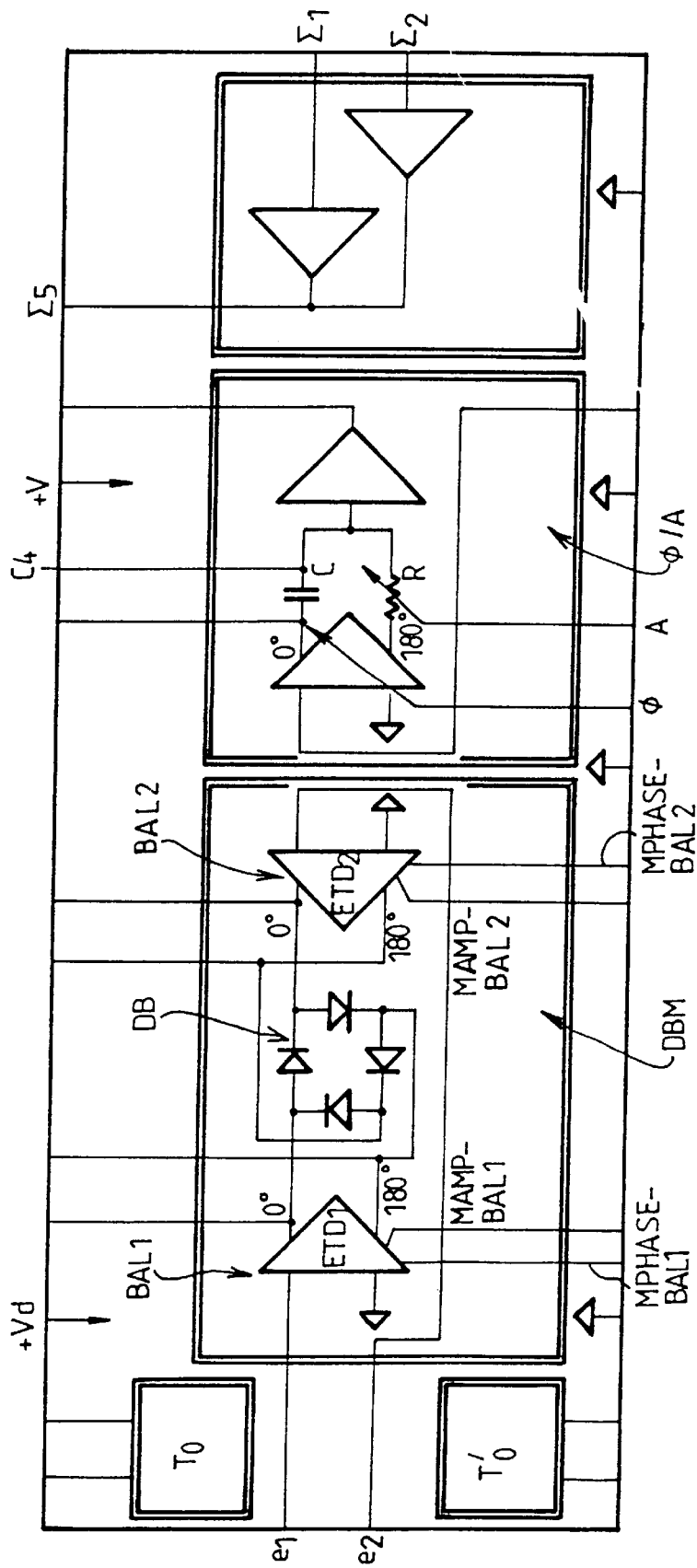
FIG. 1 is a diagram of a mixer of the invention.
Figure 1:
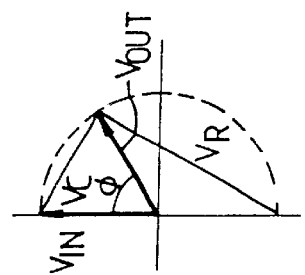

As shown in FIG. 1, the monolithic microwave integrated circuit MMIC comprises:
- a dual balanced mixer DBM;
- a phase and amplitude adjustment circuit φ/A;
- a summing circuit Σ; and
- field effect transistors (FETs) $T_0$ and $T'_0$ for temperature compensation.

The mixer operates with a local oscillator frequency of 1.5 GHZ, an RF signal having a bandwidth of 50 MHz, and an intermediate frequency signal in the range 1.45 GHz to 1.55 GHz. Rejection at the frequency of the local oscillator LO is about 25 dB prior to adjustment.

The mixer uses a diode bridge DB and two differential baluns BAL1 and BAL2 having differential stages ETD1 and ETD2, each of which receives a respective input signal $e_1$ or $e_2$ on one of its inputs.

The main cause of leakage at the frequency of the local oscillator LO is impedance mismatches between the components and balance mismatches between the baluns.

Figure 2:
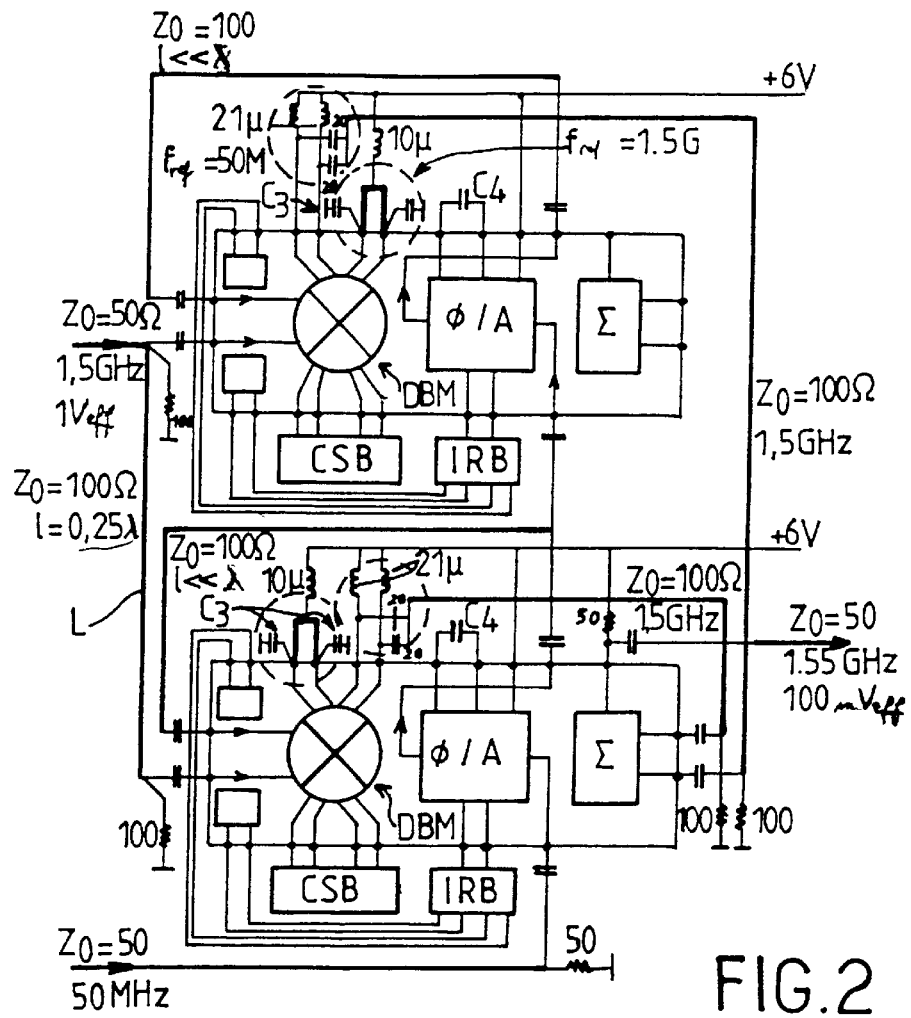
FIG. 2 shows an implementation of image frequency rejection for a FIG. 1 mixer.
Figure 4:
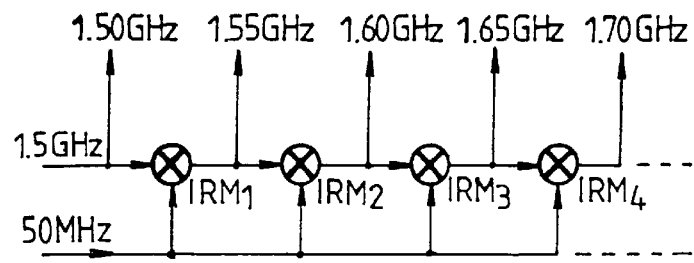
FIG. 4 shows separation into sub-bands in the context of the disclosed application to synthetic aperture radar (SAR)
Figure 3:
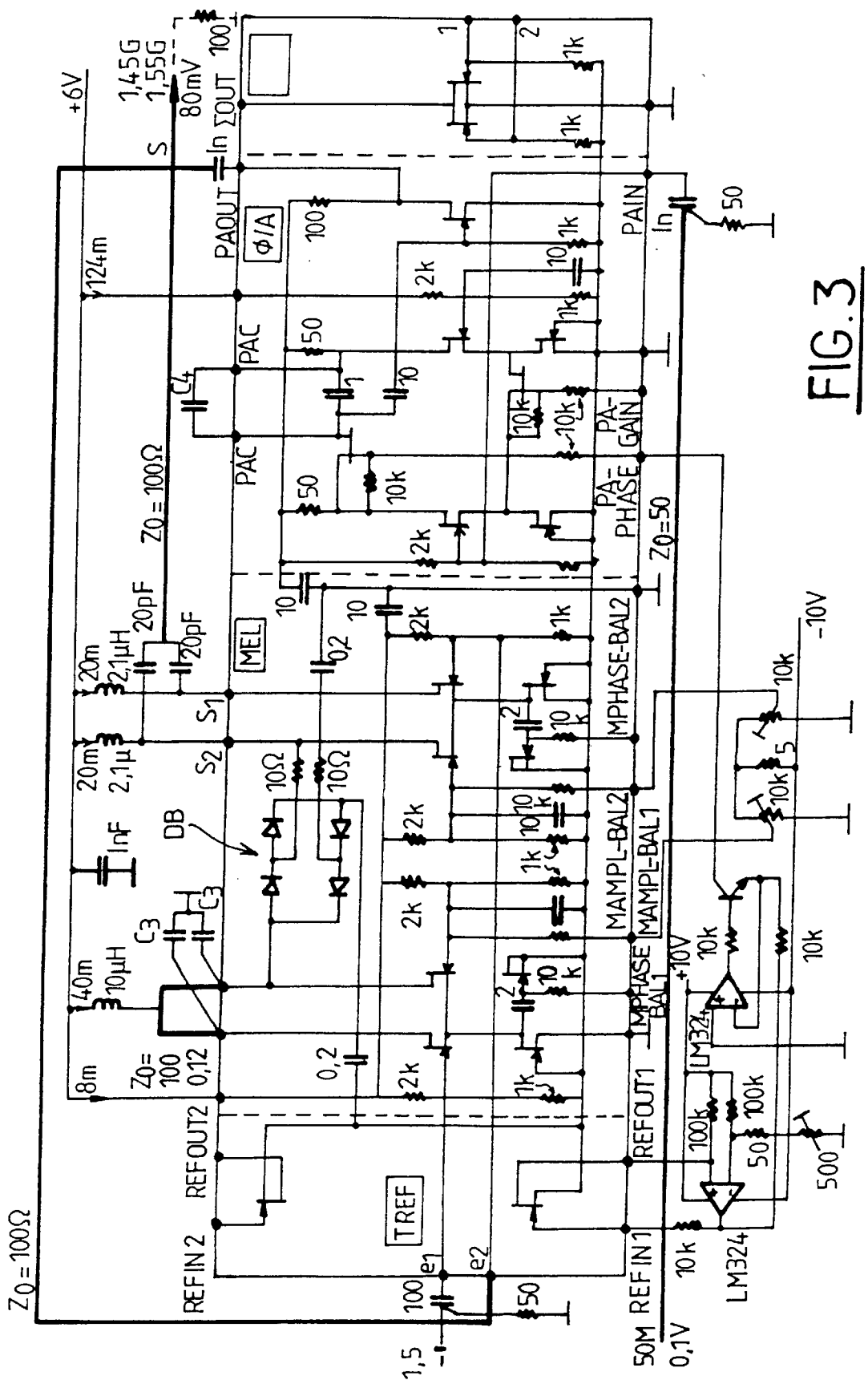
FIG. 3 shows a preferred embodiment of a mixer of the invention.

For each frequency window corresponding to a sub-band, rejection at the signal frequency of the local oscillator LO is adjusted by means of two external capacitors $C_3$ (cf. FIGS. 2 and 3). The residual unbalances of the baluns are compensated by adjusting the amplitude control voltages MAMP-BAL1 and MAMP-BAL2 to control the gains of the differential stages ETD1 and ETD2 of the baluns. The phase adjustments MPHASE-BAL1 and MPHASE-BAL2 of the baluns BAL-1 and BAL-2 can also be used to obtain the best possible rejection at the frequency of the local oscillator LO. The carrier suppression compensation voltages are applied by a module CSB that is external to the hybrid circuit (see FIG. 2).

The image frequency is rejected by independent adjustment of the phase and the amplitude at the outlet of the mixer. The phase compensation voltage φ and the amplitude compensation voltage A (FIG. 1) are applied to the circuit φ/A via a module IRB. This makes it possible to compensate for impedance mismatches between mixers and to compensate for unbalances of the separators and the mixers for the quadrature and in-phase signals. The operating frequency is adjusted by an external capacitor $C_4$ (FIGS. 1 and 2).

As shown in FIG. 2, a processing channel for a sub-band makes use of two mixers (of the type shown in FIG. 1), one for in-phase processing I and the other for quadrature processing Q. The quadrature channel is fed via a line L of length λ/4 which is external to the integrated circuit and which is preferably located on the mother card on which the integrated circuit is installed. The mixer performing in-phase processing is fed directly.

Signals are generated at the local oscillator frequency by means of the circuit shown in FIG. 3. A signal at a local oscillator frequency of 1.5 GHz is applied to the first input of a mixer $IRM_1$ whose second input receives a signal at the radio frequency IR corresponding to the bandwidth (in this case 50 MHz) of the sub-band. The mixers $IRM_1$, $IRM_2$, etc...., are connected in cascade, i.e. the output from mixer $IRM_i$ is fed to the first input of mixer $IRM_{i+1}$. The second inputs of all of the mixers receive the signal at the same frequency IR in order to define sub-bands having the same bandwidth.

Figure 5A:
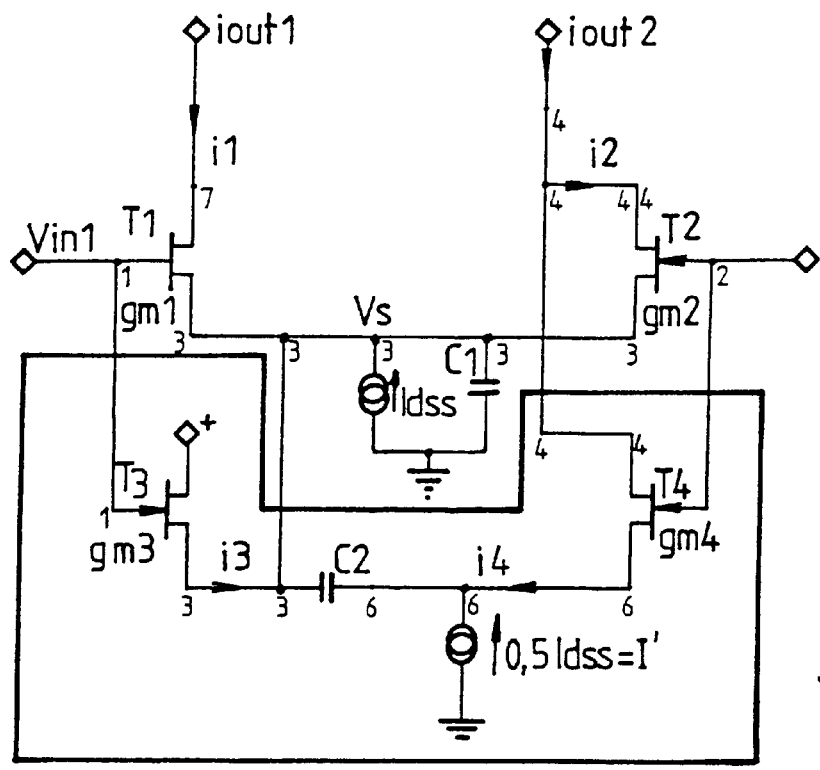
FIGS. 5a and 5b are respectively a preferred embodiment of a phase and amplitude compensation circuit of a differential stage, and a vector diagram for explaining its operation.
Figure 5B:
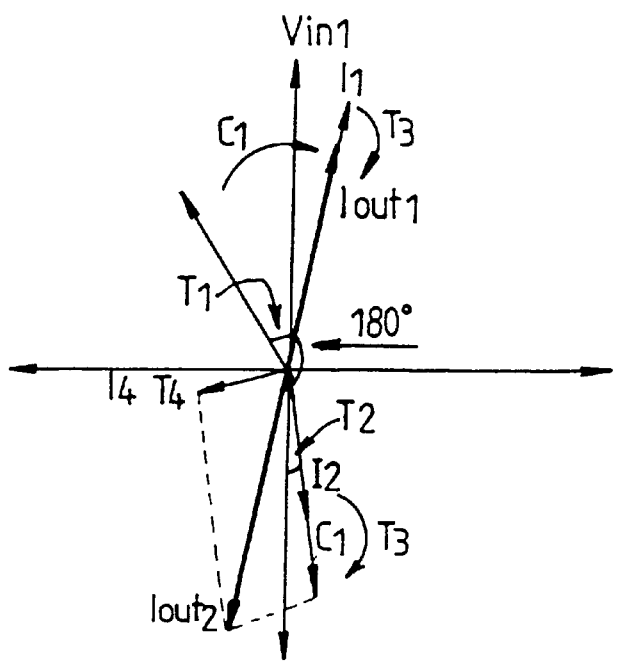

As shown in FIG. 5a, the circuit φ/A for adjusting phase and amplitude has a differential amplifier with two transistors $T_1$ and $T_2$ that are coupled together via their sources, which are taken to a source voltage $V_s$. $Id_{ss}$ designates the current flowing through the sources of the transistors $T_1$ and $T_2$, $gm_1$ and $gm_2$ designate the trans-conductances of the transistors $T_1$ and $T_2$, and $C_1$ designates the parasitic source capacitance on the transistors $T_1$ and $T_2$ which has the effect of giving rise to a phase rotation $i_1$.

Compensation is performed by means of a differential stage having two transistors $T_3$ and $T_4$ whose gates are connected to the gates of the transistors $T_1$ and $T_2$. respectively. The drain of $T_4$ is connected to the drain of $T_2$ while the drain of $T_3$ is taken to a bias voltage. The source of $T_3$ is connected to the common source of the transistors $T_1$ and $T_2$. $T_3$ and $T_4$ are transistors of smaller dimensions than $T_1$ and $T_2$ (e.g. 10% of the size of $T_1$ and $T_2$ ). A source of a current I' (e.g. I' =0.5 $Id_{ss}$) is connected to the source of $T_4$, and a compensation capacitor $C_2$ is connected between the source of $T_4$ and the interconnected sources of $T_1$, $T_2$, and $T_3$. $gm_3$ and $gm_4$ designate the transconductances of the transistors $T_3$ and $T_4$.

The capacitance selected for the compensation capacitor $C_2$ serves to take the value of $i_4$ to a value such that the output current $i_{out2}$ from $T_2$ is equal in amplitude to the output current $i_{out1}$ of $T_1$, but it is at a phase offset of 180° relative thereto: the value of $i_4$ depends on the source voltage $V_s$, on $gm_4$, and on the capacitance of $C_2$.

If the capacitance of $C_1$ is small enough, it is possible to omit the transistors $T_3$ and $T_4$. It then suffices to act on the capacitance of $C_1$ by adding a capacitor whose capacitance varies as a function of a voltage. This gives:

$$\frac{i_{out1}}{i_{out2}} = \frac{gm_1}{gm_2} e^{j\Delta\phi \left[ \frac{j\omega C_1 + gm_1 + gm_2 - 1}{gm_1} \right]}$$

What is claimed is:

1. A circuit for generating and/or detecting a radar signal for synthetic aperture radar in which the radar signal is subdivided into N sub-bands which are processed in parallel in N processing channels, each having a first mixer for processing in-phase signals, and a second mixer for processing quadrature signals, wherein the mixers of the N processing channels are in the form of identical mixer modules each comprising at least one mixer, and wherein each module is associated with at least one external element for adjusting the mixer module in correspondence with the sub-band with which it is associated, wherein N is greater than 1.

2. A circuit according to claim 1, wherein the mixers are symmetrical dual diode-switched mixers.

3. A circuit according to claim 2, wherein each dual diode mixer is coupled to inlet and outlet terminals via respective inlet and outlet baluns, forming portions of said mixer module.

4. A circuit according to claim 3, wherein the baluns have respective external control elements for adjusting amplitude balance.

5. A circuit according to claim 3, wherein the dual diode mixer has external adjustment elements constituted by external capacitors for adjusting rejection at the frequency of the local oscillator.

6. A circuit according to claim 3, wherein the baluns have respective external control elements for controlling phase balance so as to improve rejection at the frequency of the local oscillator.

7. A circuit according to claim 2, wherein one of said external elements is a quarterwave delay line for feeding the input of the second mixer in quadrature.

8. A circuit according to claim 2, wherein said dual mixers present respective external DC control elements for adjusting their RF parameters.

9. A circuit according to claim 2, wherein said dual mixers present at their outlets external devices for adjusting amplitude and phase so as to enable rejection at the image frequency to be adjusted.

10. A circuit according to claim 1, wherein the mixer module has at least one differential amplifier presenting a main differential stage having two transistors and a circuit for adjusting amplitude and phase, comprising an auxiliary differential stage having two transistors connected in parallel with the main differential stage and connected so as to inject compensation current into the drain of one of the transistors of the main differential stage, with the compensation current being adjusted by calibrating the capacitance of an external compensation capacitor interconnecting the sources of the two transistors of the auxiliary differential stage.

11. A circuit according to claim 1, wherein the mixer is disposed on a monolithic microwave integrated circuit.

12. A circuit according to claim 10, wherein said integrated circuit also has a temperature compensation circuit.

13. A circuit according to claim 11, wherein the integrated circuit also has a summing circuit.

* * * * *